United States Patent
Xiao

(10) Patent No.: US 8,907,421 B2
(45) Date of Patent: Dec. 9, 2014

(54) SUPERJUNCTION STRUCTURE, SUPERJUNCTION MOS TRANSISTOR AND MANUFACTURING METHOD THEREOF

(75) Inventor: Shengan Xiao, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 101 days.

(21) Appl. No.: 13/608,491

(22) Filed: Sep. 10, 2012

(65) Prior Publication Data

US 2013/0082323 A1  Apr. 4, 2013

(30) Foreign Application Priority Data

Sep. 30, 2011 (CN) .......................... 2011 1 0295521

(51) Int. Cl.
| | | |
|---|---|---|
| H01L 29/76 | (2006.01) | |
| H01L 29/94 | (2006.01) | |
| H01L 31/062 | (2012.01) | |
| H01L 31/113 | (2006.01) | |
| H01L 31/119 | (2006.01) | |
| H01L 29/06 | (2006.01) | |
| H01L 29/66 | (2006.01) | |
| H01L 29/78 | (2006.01) | |
| H01L 29/08 | (2006.01) | |
| H01L 29/10 | (2006.01) | |

(52) U.S. Cl.
CPC ...... *H01L 29/0634* (2013.01); *H01L 29/66734* (2013.01); *H01L 29/7813* (2013.01); *H01L 29/0878* (2013.01); *H01L 29/1095* (2013.01)
USPC ..................... 257/341; 257/342; 257/E29.257

(58) Field of Classification Search
USPC ..................... 257/328, 329, 341, 342, E27.02
See application file for complete search history.

(56) References Cited

U.S. PATENT DOCUMENTS

| | | | | |
|---|---|---|---|---|
| 2006/0284248 A1* | 12/2006 | Saito et al. | ..................... | 257/341 |
| 2007/0018243 A1* | 1/2007 | Ono et al. | ..................... | 257/330 |
| 2012/0306003 A1* | 12/2012 | Willmeroth et al. | .......... | 257/329 |

\* cited by examiner

*Primary Examiner* — Hoai V Pham
(74) *Attorney, Agent, or Firm* — MKG, LLC

(57) ABSTRACT

A superjunction structure with unevenly doped P-type pillars (4) and N-type pillars (2*a*) is disclosed. The N-type pillars (2*a*) have uneven impurity concentrations in the vertical direction and the P-type pillars (4) have two or more impurity concentrations distributed both in the vertical and lateral directions to ensure that the total quantity of P-type impurities in the P-type pillars (4) close to the substrate (8) is less than that of N-type impurities in the N-type pillars close to the substrate; the total quantity of P-type impurities in the P-type pillars close to the top of the device is greater than that of N-type impurities in the N-type pillars close to the top. A superjunction MOS transistor and manufacturing method of the same are also disclosed. The superjunction structure can improve the capability of sustaining current-surge of a device without affecting or may even reduce the on-resistance of the device.

12 Claims, 7 Drawing Sheets

(a) (b) (c) (d) (e) (f) (g) (h)

(a) (b) (c)

US 8,907,421 B2

SUPERJUNCTION STRUCTURE, SUPERJUNCTION MOS TRANSISTOR AND MANUFACTURING METHOD THEREOF

CROSS-REFERENCE TO RELATED APPLICATIONS

This application claims the priority of Chinese patent application number 201110295521.0, filed on Sep. 30, 2011, the entire contents of which are incorporated herein by reference.

TECHNICAL FIELD

The present invention relates to a power semiconductor device, and more particularly, to a superjunction semiconductor device.

BACKGROUND ART

Superjunction structure is a structure composed of alternately arranged N-type pillars and P-type pillars. A superjunction MOS transistor is formed by replacing the N-drift region of a VDMOS (Vertical Double-diffused MOSFET) device with a superjunction structure. By using a low-resistivity epitaxial layer, a superjunction MOS transistor may achieve a much lower on-resistance than a conventional VDMOS device while maintaining the same reverse breakdown voltage.

The distribution of N-type impurities in the N-type pillars, the distribution of P-type impurities in the P-type pillars, and the matching between the distributions of N-type and P-type impurities in the alternately arranged N-type and P-type pillars in a superjunction structure will affect the properties of the superjunction semiconductor device, including its reverse breakdown voltage and current handling capacity.

Generally, the alternately arranged N-type pillars and P-type pillars in a superjunction semiconductor device adopts a design of optimized electric charge balance so as to obtain a maximum reverse breakdown voltage, but in such devices, the current handling capacity is insufficient.

One method to improve the current handling capacity is to have the doping concentrations of P-type impurities in the P-type pillars in a superjunction structure unevenly distributed in the direction perpendicular to the surface of the substrate (i.e. in the vertical direction), while keeping the doping concentrations of N-type impurities in the N-type pillars evenly distributed. If the widths of the P-type and N-type pillars are equal to each other, then have the concentration of P-type impurities in the upper part of the P-type pillars higher than the concentration of N-type impurities in the N-type pillars, and have the concentration of P-type impurities in the lower part of the P-type pillars lower than the concentration of N-type impurities in the N-type pillars. Based on the above method, Infineon Technologies proposed a detailed solution to divide each P-type pillar in the superjunction structure into six sections along the vertical direction, and let the concentrations of P-type impurities in the six sections from the top down be respectively 30%, 20%, 10%, 0%, −10% and −20% higher than the concentration of P-type impurities in an optimized electric charge balance.

Currently, manufacturing methods of superjunction structure in a superjunction semiconductor device can be overall classified into two types. The first type is to either form an epitaxial layer of one doping type with a certain thickness and then perform lithography and ion implantation in certain regions of the epitaxial layer to form pillars of another doping type, or form an undoped epitaxial layer with a certain thickness, and then perform lithography and ion implantation to form N-type and P-type pillars in the epitaxial layer; the above step is repeated for a few times to form N-type and P-type pillars with a desired thickness. The second type is to etch trenches in a region of one doping type, and then perform trench filling, or epitaxy or ion implantation to the trenches to form pillars of another doping type for one-time.

The above described superjunction structure with improved current handling capacity requires a variation in the impurity concentrations distributed in the P-type pillars. But depending on the existing art, the method of the second type is impractical, and the method of the first type has shortcomings of high process costs, long manufacturing time and great difficulty in production control.

SUMMARY OF THE INVENTION

An objective of the present invention is to provide a new type of superjunction structure to improve the capability of sustaining current-surge during the turn-off transient of a device without affecting the reverse breakdown voltage of the device. A manufacturing method of the superjunction structure is also provided.

To achieve the aforementioned objective, the present invention provides a superjunction structure, which includes an N-type epitaxial layer and a plurality of P-type pillars formed in the N-type epitaxial layer; a part of the N-type epitaxial layer between each two adjacent P-type pillars serves as an N-type pillar, so as to form alternately arranged P-type pillars and N-type pillars in the N-type epitaxial layer;

each P-type pillar is unevenly doped both in vertical and lateral directions; a doping concentration in a lower portion of the P-type pillar is less than or equal to a doping concentration in an upper portion of the P-type pillar;

each N-type pillar is unevenly doped in the vertical direction; a doping concentration in a lower portion of the N-type pillar is greater than or equal to a doping concentration in an upper portion of the N-type pillar;

in a bottom of the superjunction structure, a total quantity of P-type impurities in P-type pillars is less than a total quantity of the N-type impurities in the N-type pillars;

in a top of the superjunction structure, a total quantity of P-type impurities in P-type pillars is greater than a total quantity of N-type impurities in the N-type pillars.

The superjunction structure of the present invention can also be achieved by changing all the above elements to reverse doping types.

Each P-type pillar is unevenly doped both in vertical and lateral directions, for example, by such structure: each P-type pillar includes at least two sections in the vertical direction, wherein a second section from the top down has a groove formed in its top; the groove has a profile wider at the top and narrower at the bottom; a first section from the top down is formed in the groove and also has a shape wider at the top and narrower at the bottom; each section of a P-type pillar is evenly doped, and the doping concentrations in the respective sections of a P-type pillar decrease from the top down.

The present invention further provides a manufacturing method of the superjunction structure. The method includes the following steps:

step 1: form a plurality of trenches in an N-type epitaxial layer by lithography and etch; a part of the N-type epitaxial layer between each two adjacent trenches serves as an N-type pillar;

step 2: fill the trenches with a P-type silicon by conducting at least two filing steps from the bottom up; a latter filing step adopts a greater doping concentration of the P-type silicon than a former filing step, wherein the P-type silicon filled by the second last filing step in each trench has a groove formed in its top; the groove has a profile wider at the top and narrower at the bottom; the P-type silicon filled by the last filing step in each trench is formed in the groove formed by the second last filing step;

step 3: remove the P-type silicon above a surface of the N-type epitaxial layer; the remaining P-type silicon filled by the last filing step in each trench serves as the first section (top section) of the P-type pillar, and the remaining P-type silicon filled by the second last filing step serves as the second section of the P-type pillar from the top down.

Take the embodiments of the present invention as example, the superjunction structure of the present invention has such features that the impurity distributions in the P-type and N-type pillars are both uneven, wherein the impurity distributions in the N-type pillars are uneven in the vertical direction; the impurity distributions in the P-type pillars adopt two or more doping concentrations both in the vertical and in the lateral directions to ensure that the total quantities of P-type impurities in the part of the P-type pillars close to the N-type heavily doped substrate (i.e., the bottom of the superjunction structure) is less than the total quantity of N-type impurities in the part of the N-type pillars close to the substrate, while the total quantity of P-type impurities in the part of the P-type pillars close to the top of the device (i.e., the top of the superjunction structure) is greater than the total quantity of N-type impurities in the part of the N-type pillars close to the top.

As the total quantity of P-type impurities is greater than that of N-type impurities in the top region of the device, the capability of sustaining current-surge of the device during the turn-off transient can be improved.

As the P-type pillars are unevenly doped both in the vertical and lateral directions, the regional electric fields in the P-type pillars become stronger, so that the breakdown of the device will occur in the P-type pillars, thus improving the stability of the capability of sustaining current-surge of the device.

As the part of the P-type pillars close to the N-type heavily doped substrate has a doping concentration no greater than the doping concentration when the P-type pillars are evenly doped, the on-resistance of the device will not be affected, or may even be reduced.

The manufacturing method of the superjunction structure also has the advantages of short processing cycle and low production costs.

DETAILED DESCRIPTION

Figure 1:
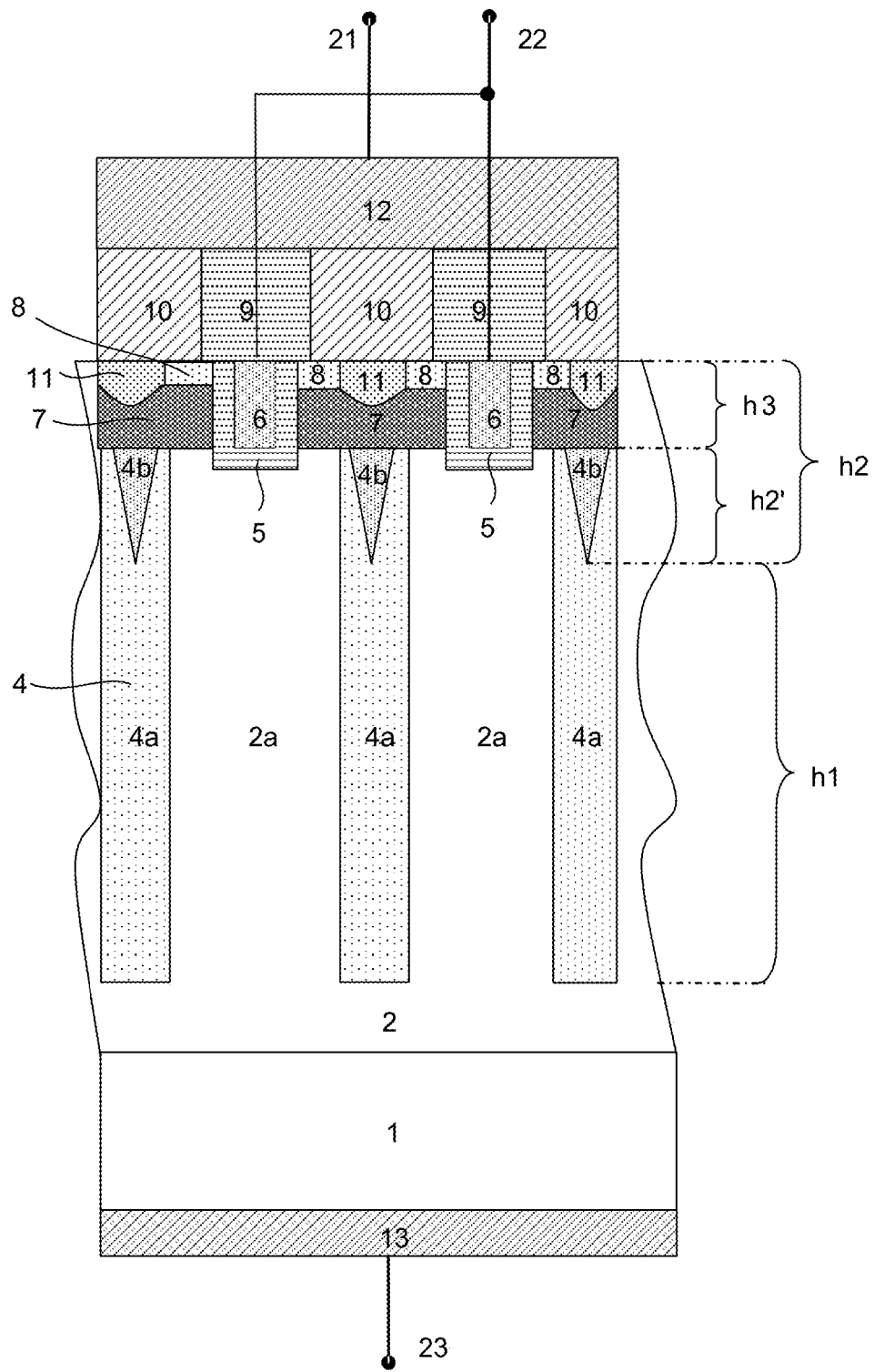
FIG. 1 is a cross sectional view of the superjunction MOS transistor according to an embodiment of the present invention.

FIG. 1 is a superjunction MOS transistor employing the superjunction structure according to an embodiment of the present invention. The superjunction MOS transistor includes a heavily doped N-type substrate 1 and an N-type epitaxial layer 2 formed thereon; a plurality of P-type pillars 4 are formed in the N-type epitaxial layer 2, and a part of the N-type epitaxial layer 2 between each two adjacent P-type pillars 4 serves as an N-type pillar 2a, so as to form alternately arranged P-type pillars 4 and N-type pillars 2a in the N-type epitaxial layer 2, namely forming a superjunction structure.

As FIG. 1 illustrates a cross sectional view of a wafer, the P-type pillars 4 and the N-type pillars 2a all seem to have a rectangular shape. However, in a three-dimensional view, the P-type pillars 4 and the N-type pillars 2a may extend in a direction perpendicular to the rectangular cross sections for a relatively long distance and form wall-like shapes; or the P-type pillars 4 and the N-type pillars 2a may extend in a direction perpendicular to the rectangular cross sections for a relatively short distance and form pillar-like shapes. In the implementation of wall-like shapes, the overall shape of a P-type pillar 4 or an N-type pillar 2a is approximately rectangular parallelepiped shaped, and may have chamfering structures or arc structures at the edges. In the implementation of pillar-like shapes, the horizontal cross section of a P-type pillar 4 or an N-type pillar 2a may have a shape of a polygon such as rectangle, square, hexagon and octagon.

Each P-type pillar 4 includes two parts: a main body 4a and an additional structure 4b; both the P-type pillar 4 and its main body 4a have a height of h1+h2'. A groove is formed in the top of the main body 4a and has a profile wider at the top and narrower at the bottom; a distance between the bottom of the groove and the bottom of the P-type pillar 4 h1 is, for example, from 25 μm to 30 μm. The additional structure 4b is formed in the groove on the top of the main body 4a and completely fills the groove, and therefore the additional structure 4b also has a profile wider at the top and narrower at the bottom. The height of the additional structure 4b h2' is, for example, from 2 μm to 8 nm. The main body 4a and the additional structure 4b are combined to form a rectangular profile.

FIG. 4(a) to FIG. 4(h) illustrate various implementations of the main body 4a and the additional structure 4b. The profile wider at the top and narrower at the bottom may be V-shaped (FIG. 4(a)), trapezoid-shaped (FIG. 4(b)), funnel-shaped (FIG. 4(c)), or in other shapes.

Each N-type pillar 2a is unevenly doped, and a doping concentration in a lower portion of the N-type pillar 2a is always greater than or equal to a doping concentration in an upper portion of the N-type pillar 2a, namely, the doping concentration in the N-type pillar 2a is greatest at the bottom and lowest at the top. In each P-type pillar 4, both the main body 4a and the additional structure 4b are evenly doped and the doping concentration of the main body 4a is lower than the doping concentration of the additional structure 4b. In the bottom of the P-type pillars 4 (i.e., the region close to the N-type heavily doped substrate 1), a total quantity of P-type impurities in a P-type pillar 4 is less than a total quantity of N-type impurities in an N-type pillar 2a; in the top of the P-type pillars 4, a total quantity of P-type impurities in a P-type pillar 4 is greater than a total quantity of N-type impurities in an N-type pillar 2a.

In a preferred embodiment, in each P-type pillar 4, the doping concentration of the main body 4a is lower than or equal to an even doping concentration of the P-type pillar 4 and the doping concentration of the additional structure 4b is greater than or equal to 3 times of the even doping concentration of the P-type pillar 4, wherein the even doping concentration of the P-type pillar 4 is defined as the doping concentration of the P-type pillar 4 when the P-type pillars 4 are evenly doped and the total quantity of the P-type impurities in a P-type pillar 4 is equal to the total quantity of the N-type impurities in an N-type pillar 2a. For example, in each P-type pillar 4, the doping concentration of the main body 4a may be 0.5~1 time of the even doping concentration of the P-type pillar 4, and the doping concentration of the additional structure 4b may be 3~10 times of the even doping concentration of the P-type pillar 4.

In addition to the above new type of superjunction structure, FIG. 1 further includes some other structures of a conventional VDMOS device. For example, there is a bowl-shaped gate oxide layer 5 in contact with the top of each N-type pillar 2a; each gate oxide layer 5 surrounds a polysilicon gate 6. A P-well 7 is formed corresponding to each P-type pillar 4 and is in contact with the top of the P-type pillar 4 and parts of the tops of the N-type pillars 2a adjacent to the P-type pillar 4. N-type heavily doped source regions 8 and P-type heavily doped contact regions 11 are formed within the P-wells 7. A dielectric layer 9 is formed above the gate oxide layers 5 and the polysilicon gates 6. Contact hole electrodes 10 are formed above the N-type heavily doped source regions 8 and the P-type heavily doped contact regions 11. A surface metal layer 12 is formed on the dielectric layer 9 and the contact hole electrodes 10. A source electrode 21 is picked up from the surface metal layer 12. Gate electrodes 22 are picked up from the polysilicon gates 6. A backside metal layer 13 is formed on a backside of the N-type heavily doped substrate 1, and a drain electrode 23 is picked up from the backside metal layer 13. All the above elements in FIG. 1 form an entire superjunction MOS transistor.

Obviously, it will be still practicable that all the above elements in FIG. 1 are formed with reverse doping types (N-type replaced by P-type, while P-type replaced by N-type).

One objective of the present invention is to provide a new type of superjunction structure. Although FIG. 1 only illustrates an embodiment applying the new type of superjunction structure to a superjunction MOS transistor, the new type of superjunction structure can also be applied to other superjunction semiconductor devices, such as IGBT (insulated-gate bipolar transistor), diodes, and so on.

A manufacturing method of the superjunction structure of the present invention will be described in details below. Take a superjunction MOS transistor employing the superjunction structure in FIG. 1 for example, the manufacturing method includes the following steps:

Step 1: form an N-type epitaxial layer 2 on an N-type heavily doped substrate 1 by epitaxial growth. The N-type epitaxial layer 2 is unevenly doped and has a thickness of, for example, 45 μm. A doping concentration in a lower portion of the N-type epitaxial layer 2 is always greater than or equal to a doping concentration in an upper portion of the N-type epitaxial layer 2, which can be achieved by epitaxy process. Existing epitaxy equipments are already capable of growing epitaxial layers with variable (can be defined according to needs) doping concentrations.

Figure 2A:
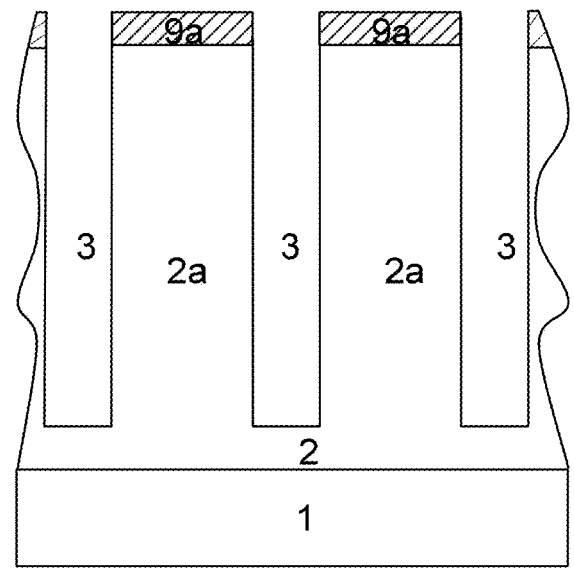
FIG. 2a to FIG. 2d are cross sectional views of the superjunction structure in the respective steps of the manufacturing method according to an embodiment of the present invention.

Step 2: referring to FIG. 2a, form a plurality of trenches 3 in the N-type epitaxial layer 2 by lithography and etch for forming P-type pillars 4 in subsequent steps, wherein the trenches 3 have a width of, for example, 4 μm. A part of the N-type epitaxial layer 2 between each two adjacent trenches 3 serves as an N-type pillar 2a, and the N-type pillars 2a have a width of, for example, 4 μm.

Generally, a dielectric layer (e.g. silicon dioxide) with a thickness of from 300 Å to 500 Å may further be deposited on the N-type epitaxial layer 2, and will become a dielectric layer 9a after lithography and etch.

Figure 2B:
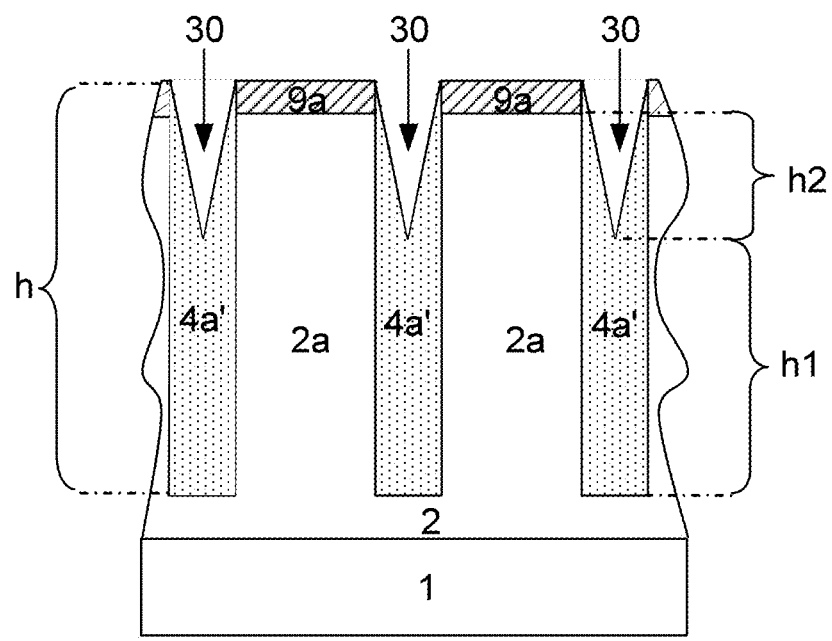

Step 3: referring to FIG. 2b, fill each trench 3 with a P-type monocrystalline silicon to form first trench filling layers 4a', wherein, the height of the first filling layers 4a' h is equal to the sum of the heights of the N-type epitaxial layer 2 and the dielectric layer 9a. The P-type monocrystalline silicon filled in each trench has a groove 30 formed in its top. The groove 30 has a profile wider at the top and narrower at the bottom. A distance between the bottom of the groove 30 and the bottom of the respective trench 3 is h1. The groove 30 may have any one of the shapes shown in FIG. 4(a) to FIG. 4(h). The first trench filling layers 4a' are embryonic forms of the main bodies 4a to be formed in subsequent steps.

Figure 2C:
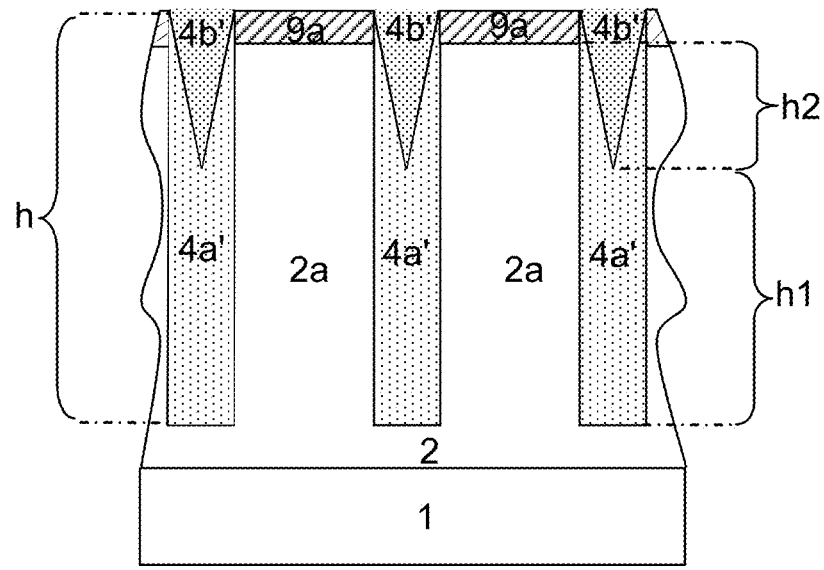

Step 4: referring to FIG. 2c, fill P-type monocrystalline silicon with a greater doping concentration than step 3 into the grooves 30 in the tops of the first trench filling layers 4a' to form second trench filling layers 4b' in the grooves 30. The second trench filling layers 4b' are embryonic forms of the additional structures 4b to be formed in subsequent steps.

The above step 3 and step 4 may be implemented by epitaxial growth. The existing processes are capable of forming groove structures in the top of the first trench filling layers 4a'.

Figure 2D:
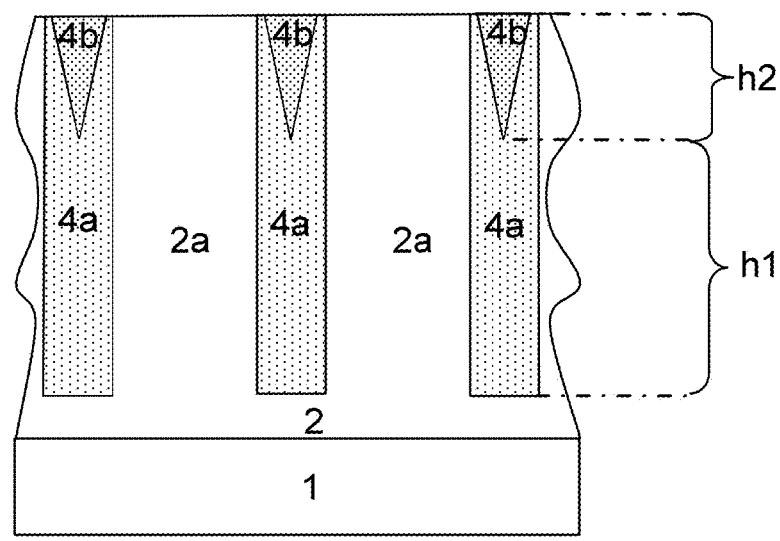

Step 5: referring to FIG. 2d, remove the parts of the first trench filling layers 4a' and the parts of the second trench filling layers 4b' above the surface of the N-type epitaxial layer 2. This step may be conducted by, for example, chemical mechanical polishing (CMP) or dry etch (etch back) process to polish or etch the silicon in the trenches until the surface of the N-type epitaxial layer 2 is reached. It is also practical to polish or etch the silicon in the trenches until a certain depth below the surface of the N-type epitaxial layer 2 is reached, and the maximum depth is, for example, less than 3000 Å. The remaining first trench filling layer 4a' in each trench forms a main body 4a of the P-type pillar, and the remaining second trench filling layer 4b' in each trench forms an additional structure 4b of the P-type pillar, wherein the additional structure 4b has a height of h2.

If there is a dielectric layer 9a formed on the N-type epitaxial layer 2, it should be entirely removed by dry etch or wet etch after the polishing or etching back process.

The distance between the bottom of the main body 4a and the bottom of the groove h1 may be, for example, 25 μm to 30 μm. The height of the additional structure 4b h2 may be, for example, 5 μm to 10 μm. The heights of the P-type pillar 4, the main body 4a and the N-type pillar 2a are all h1+h2.

The manufacturing method of the superjunction structure of the present invention has been described in the above step 2 to step 5. The following steps are merely manufacturing method of conventional VDMOS devices, and therefore will be described less detailedly.

Step 6: form a trench in each N-type pillar 2a by lithography and etch for forming a polysilicon gate 6 in the subsequent steps. The trench has a width of, for example, less than 2 μm.

Step 7: form a silicon dioxide layer on side walls and the bottom of each trench formed in step 6 by thermal oxidation. The silicon dioxide layers serve as gate oxide layers 5, and the gate oxide layers 5 have a thickness of, for example, 1000 Å.

A silicon dioxide layer (not shown) is also formed on top surface of each P-type pillar 4 during the thermal oxidation process to serve as a silicon protection layer during the subsequent polysilicon etching process. The silicon dioxide layer on top surface of each P-type pillar 4 will be partly removed during the polysilicon etching process; its thickness may also be reduced during some wet etching processes; the remaining silicon dioxide layer may serve as a buffer layer during the subsequent ion implantation process. The silicon dioxide layer covering the contact hole regions will be totally removed in step 12 when etching contact holes or be totally removed before step 12.

Step 8: fill each trench formed in step 6 with polysilicon by deposition, and then remove the polysilicon above the N-type epitaxial layer 2 by planarization or dry etch process, so as to form a polysilicon gate 6 in each trench formed in step 6.

Step 9: form a P-well 7 above each P-type pillar 4 by lithography and ion implantation, wherein, the doping concentration of P-type impurity in the P-well 7 is, for example, from $1 \times 10^{17}$ atoms/cm$^3$ to $9 \times 10^{17}$ atoms/cm$^3$; the height of the P-well 7 h3 is, for example, from 1.5 µm to 3 µm; the three-dimensional shape of the P-well 7 is the same with the P-type pillars 4 and the N-type pillars 2a, namely wall-shaped or pillar-shaped. After the formation of the P-wells 7, the height of the P-type pillars 4 and the height of the main bodies 4a of the P-type pillars 4 is reduced to h1+h2', and the height of the additional structures 4b is reduced to h2', wherein h2'=h2−h3.

Step 10: form N-type heavily doped source regions 8 in each P-well 7 by performing lithography and ion implantation to certain regions of the P-well 7, wherein the doping concentration of N-type impurity in the heavily doped N-type source regions 8 is greater than $1 \times 10^{20}$ atoms/cm$^3$.

Step 11: deposit a dielectric layer 9 on the entire substrate, wherein the dielectric layer 9 has a thickness of, for example, from 5000 Å to 10000 Å.

Step 12: form contact holes in the dielectric layer 9 by lithography and etch; each contact hole is located above a P-well 7 and is connected to the P-well 7.

Step 13: form a P-type heavily doped contact region 11 in the P-well 7 under each contact hole, wherein the doping concentration of P-type impurity in the P-type heavily doped contact regions 11 is, for example, higher than $1 \times 10^{18}$ atoms/cm$^3$.

Step 14: fill metal into the contact holes by deposition and remove the metal above the dielectric layer 9 by planarization, so as to form a contact hole electrode 10 in each contact hole.

Step 15: deposit a surface metal layer 12 on the entire substrate and pick up a source electrode 21 from the surface metal layer 12; pick up a gate electrode 22 from the polysilicon gates 6; the surface metal layer 12 has a thickness of, for example, from 10000 Å to 50000 Å.

Step 16: perform backside grinding to the N-type heavily doped substrate 1 by, for example, chemical mechanical polishing (CMP), and deposit a backside metal layer 13 on the backside of the N-type heavily doped substrate 1; a drain electrode 23 is picked up from the backside metal layer 13.

Figure 5:
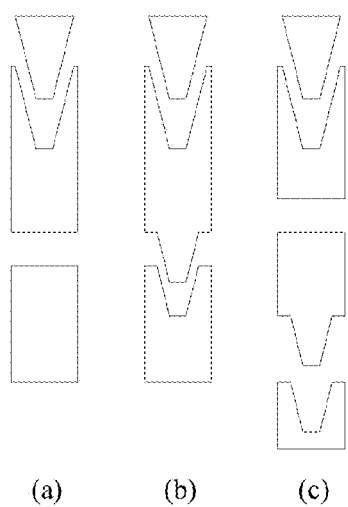

In the superjunction structure shown in FIG. 1, a P-type pillar 4 has two sections from the top down; in other embodiments, a P-type pillar 4 may have more than two sections in the vertical direction as shown in FIG. 5(a) to FIG. 5(c), in which a second section from the top down has a groove formed in its top, and the groove has a profile wider at the top and narrower at the bottom (the groove may be of any shape as shown in FIG. 4(a) to FIG. 4(h)); a first section from the top down is formed in the groove and also has a shape wider at the top and narrower at the bottom; each of the remaining sections of the P-type pillar 4 may have a flat top surface or a surface with a groove, which shall not be limited; the bottom surface of an upper section is always matched with the top surface of a lower section directly under it, that is to say, if the top surface of a lower section is flat, the bottom surface of the upper section is also flat; if a groove is formed in the top surface of a lower section, the bottom surface of the upper section is fully filled in the groove. P-type impurities are evenly doped in each section of a P-type pillar, while the doping concentrations of the respective sections in a P-type pillar decrease from the top down.

In the manufacturing method of superjunction structure described in step 2 to step 5 above, each P-type pillar 4 is divided to two sections, which may only represent as an example. In the cases that a P-type pillar 4 has more than two sections as shown in FIG. 5(a) to FIG. 5(c), the second section from the top down has a groove formed in its top, and the groove has a profile wider at the top and narrower at the bottom; while the first section from the top down is formed in the groove and also has a profile wider at the top and narrower at the bottom; the rest part of the P-type pillar 4 may be divided into n sections, and the profile of each section is not limited. In such cases, the above step 3 and step 4 will be combined and modified as follows: fill the trenches with P-type silicon by conducting more than two filing steps from the bottom up, wherein a latter filing step adopts a greater doping concentration of the P-type silicon than a former filing step; the P-type silicon filled by the second last filing step in each trench has a groove formed in its top, and the groove has a profile wider at the top and narrower at the bottom; the P-type silicon filled by the last filing step in each trench is filled in the groove formed by the second last filing step. Besides, the above step 5 will be modified as follows: remove the P-type silicon filled by the second last and the last filing steps above the surface of the N-type epitaxial layer; the remaining P-type silicon filled by the last filing step in the trench forms the first section of a P-type pillar and the remaining P-type silicon filled by the second last filing step in the trench forms a second section from the top.

The description below will focus on the relationship between the doping concentrations in the P-type pillars and the doping concentrations in the N-type pillars of the superjunction structure of the present invention. For the convenience of description, a practical application environment is given as an example as follows: in a superjunction MOS transistor as shown in FIG. 1, the reverse breakdown voltage of the superjunction MOS transistor is 600V; the resistivity of the N-type heavily doped substrate 1 is from 0.001 Ω·cm to 0.003 Ω·cm; both the widths of each P-type pillar 4 and each N-type pillar 2a are 4 µm; the thickness of the N-type epitaxial layer 2 is 45 µm; and the height of each P-type pillar 4, h1+h2', is 35 µm, wherein h1 is 25 µm and h2' is 10 µm.

Figure 3A:
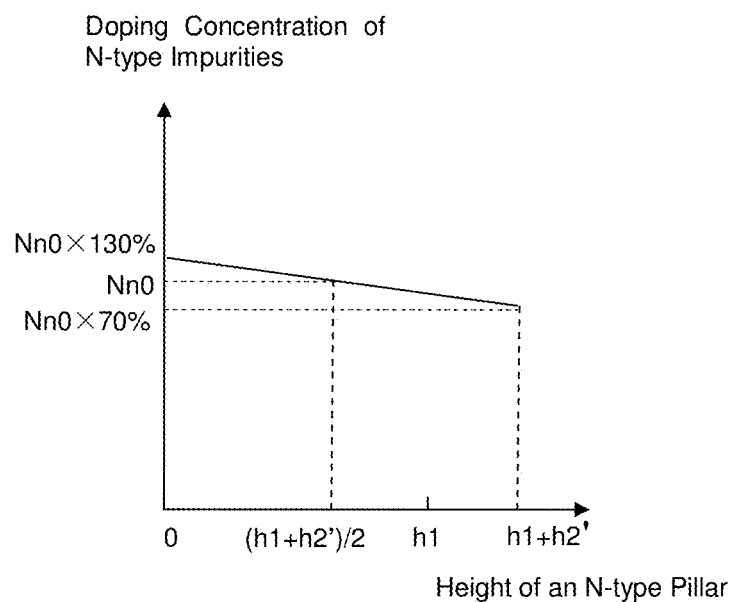
FIG. 3a to FIG. 3f are schematic views of the relationship between doping concentrations in P-type pillars and in N-type pillars of the superjunction structure according to embodiments of the present invention.

Example 1 referring to FIG. 3a, the horizontal axis indicates the height of an N-type pillar 2a; the horizontal coordinate of zero indicates the lowest position of a P-type pillar 4; the horizontal coordinate of h1 indicates the lowest position of the additional structure 4b in a P-type pillar 4; the horizontal coordinate of h1+h2' indicates the highest position of a P-type pillar 4; the doping concentration of the N-type pillar 2a is represented by the solid line, which shows a linear change; the doping concentration at the center position in the vertical direction in the N-type pillar (corresponding to the horizontal coordinate of (h1+h2')/2) is Nn0; the doping concentration at the bottom of the N-type pillar is Nn0×130%; and the doping concentration at the top of the N-type pillar is Nn0×70%; wherein Nn0 is, for example, $3 \times 10^{15}$ atoms/cm$^3$.

In this case, the optimal doping concentration Pp0 of the P-type pillar 4 is equal to Nn0, wherein Pp0 is defined as the doping concentration of the P-type pillar 4 when the P-type pillar 4 is completely evenly doped (i.e., the P-type pillar 4 only has the main body 4a and does not have the additional structure 4b, and the main body 4a is evenly doped), and the total quantity of P-type impurities in the P-type pillar 4 is equal to the total quantity of N-type impurities in the N-type pillar 2a. The definition of Pp0 remains unchanged throughout the description.

Figure 3B:
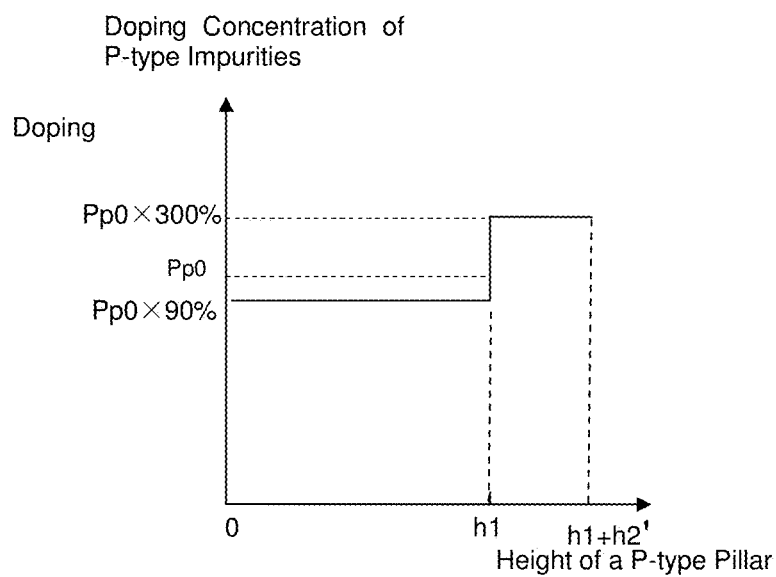
Figure 3C:
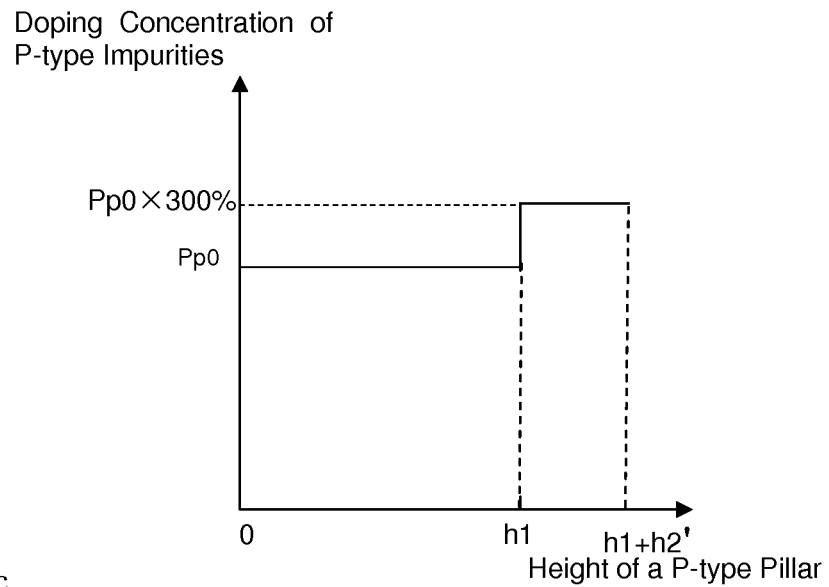
Figure 3D:
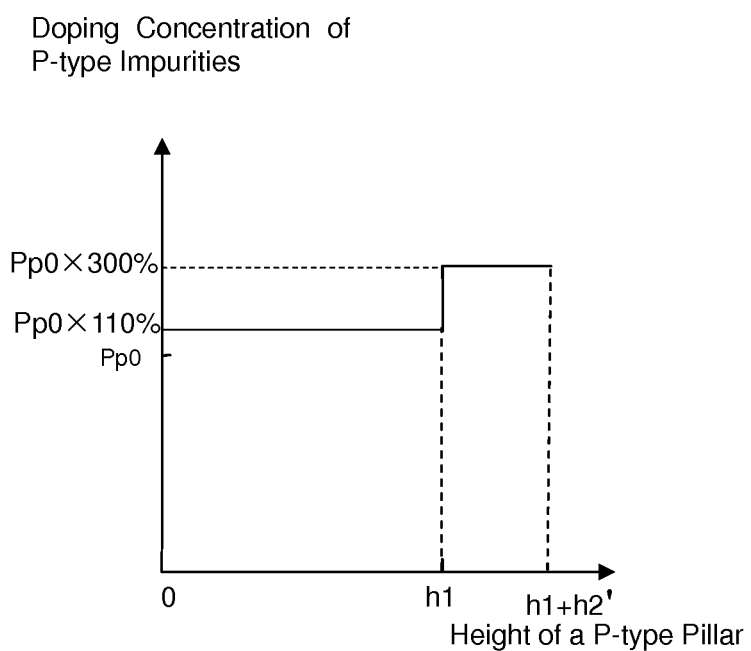

The doping concentrations in a P-type pillar 4 in the superjunction structure of the present invention may be selected as follows:

Option 1: the doping concentration of the main body 4a of the P-type pillar is lower than Pp0, and the doping concentration of the additional structure 4b of the P-type pillar is greater than Pp0. For example, referring to FIG. 3b, the horizontal axis in FIG. 3b has the same indication with that in FIG. 3a; the doping concentration of the P-type pillar 4 is represented by the solid line; the doping concentration of the main body 4a is Pp0×90%; the doping concentration of the additional structure 4b is Pp0×300%. In a height range of from h1 to h1+h2', the real structure of the P-type pillar 4 shall include both a part of the main body 4a and the additional structure 4b, however, only the doping concentration of the additional structure 4b is shown in FIG. 3b, and it is the same in FIG. 3c and FIG. 3d.

Option 2: the doping concentration of the main body 4a of the P-type pillar is equal to Pp0, and the doping concentration of the additional structure 4b of the P-type pillar is greater than Pp0. For example, referring to FIG. 3c, the horizontal axis in FIG. 3c has the same indication with that in FIG. 3a; the doping concentration of the P-type pillar 4 is represented by the solid line; the doping concentration of the main body 4a is Pp0 and the doping concentration of the additional structure 4b is Pp0×300%.

Option 3: the doping concentration of the main body 4a of the P-type pillar is greater than Pp0, but lower than the highest doping concentration in the N-type pillar 2a, which is Nn0×130%, and the doping concentration of the additional structure 4b of the P-type pillar is greater than Pp0. For example, referring to FIG. 3d, the horizontal axis in FIG. 3d has the same indication with that in FIG. 3a; the doping concentration of the P-type pillar 4 is represented by the solid line; the doping concentration of the main body 4a is Pp0×110% and the doping concentration of the additional structure 4b is Pp0×300%.

Figure 3E:
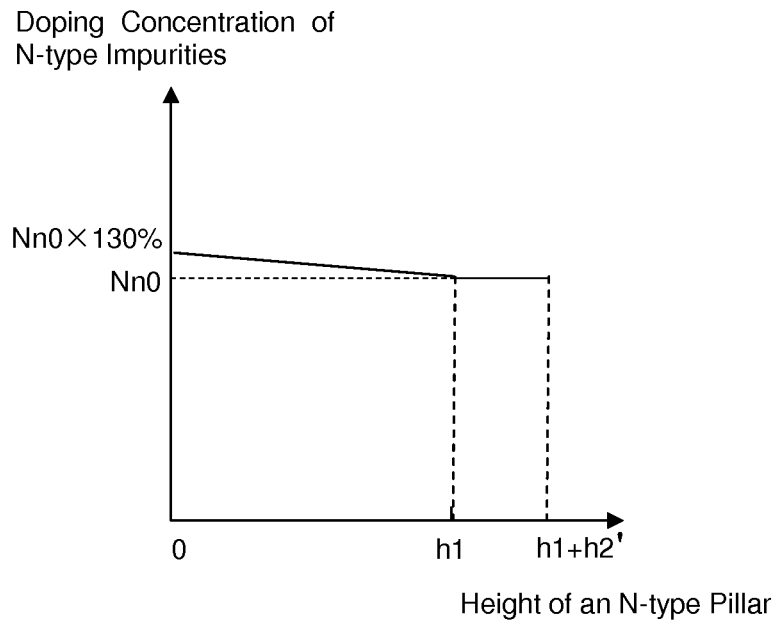

Example 2 referring to FIG. 3e, the horizontal axis in FIG. 3e has the same indication with that in FIG. 3a; the doping concentration of the N-type pillar 2a is represented by the solid line; the doping concentration of the N-type pillar 2a changes linearly in the height range of the P-type pillar 4 excluding the additional structure 4b (i.e., in the height range of from 0 to h1); the doping concentration of the N-type pillar 2a at a position corresponding to the lowest position of the additional structure 4b of the P-type pillar is Nn0; the doping concentration is Nn0×130% at the bottom of the N-type pillar 2a; the N-type pillar 2a has a constant doping concentration of Nn0 in the height range of the additional structure 4b of the P-type pillar (i.e., in the height range of from h1 to h1+h2'); wherein Nn0 is, for example, $3 \times 10^{15}$ atoms/cm$^3$.

In this case, the optimal doping concentration Pp0 of the P-type pillar 4 is equal to $(h1 \times 1.15 + h2') \times Nn0/(h1+h2')$, wherein the value 1.15 is the ratio of the average doping concentration of the linearly changed portion of the N-type pillar 2a to Nn0.

The doping concentrations in the P-type pillar 4 in the superjunction structure of the present invention may be selected as follows: the doping concentration of the main body 4a of the P-type pillar is equal to Pp0, and the doping concentration of the additional structure 4b of the P-type pillar is greater than Pp0. For example, referring to FIG. 3c, the doping concentration of the main body 4a is Pp0 and the doping concentration of the additional structure 4b is Pp0× 300%.

Figure 3F:
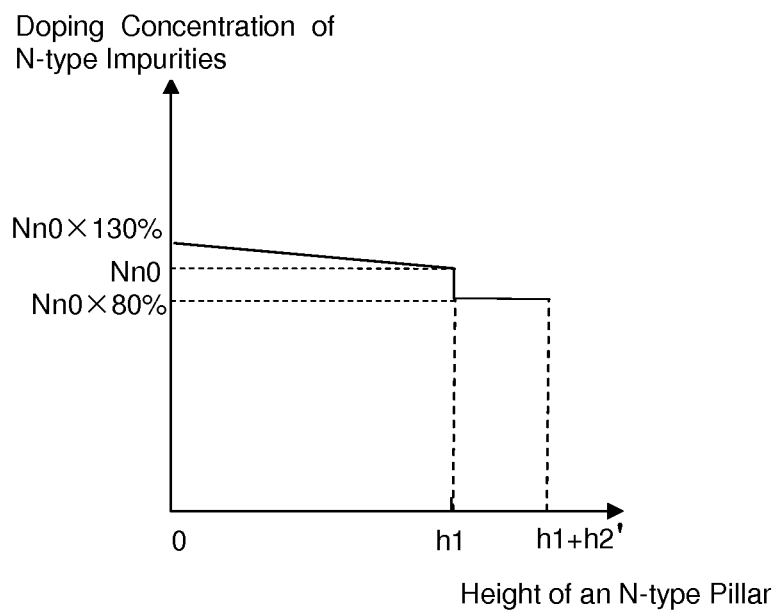
Figure 4:
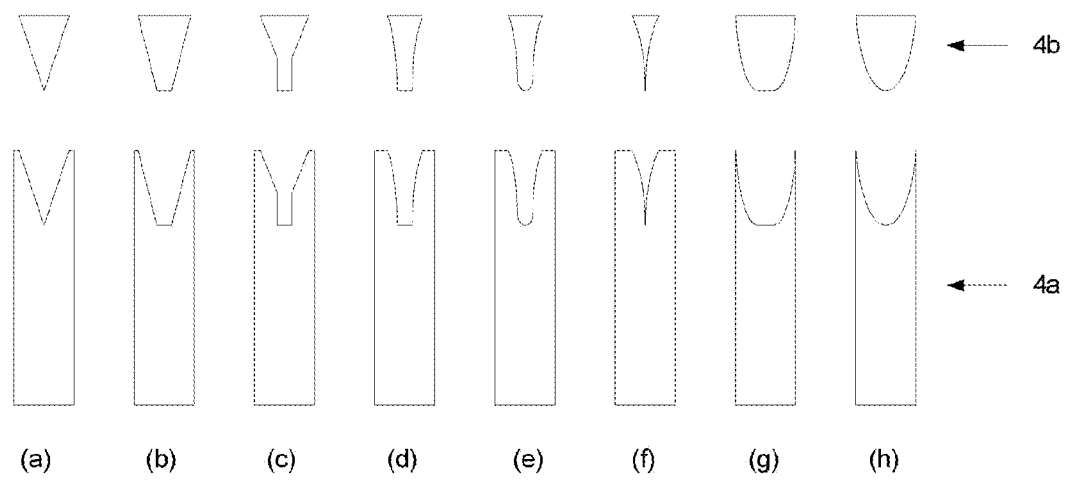
FIG. 4(a) to FIG. 4(h) and FIG. 5(a) to FIG. 5(c) illustrate various implementations of the P-type pillars of the superjunction structure of the present invention.

Example 3 referring to FIG. 3f, the horizontal axis in FIG. 3f has the same indication with that in FIG. 3a; the doping concentration of the N-type pillar 2a is represented by the solid line; the doping concentration of the N-type pillar 2a changes linearly in the height range of the P-type pillar 4 excluding the additional structure 4b (i.e., in the height range of from 0 to h1); the doping concentration of the N-type pillar 2a at a position corresponding to the lowest position of the additional structure 4b of the P-type pillar is Nn0; the doping concentration is Nn0×130% at the bottom of the N-type pillar 2a; the N-type pillar 2a has a constant doping concentration of Nn0×80% in the height range of the additional structure 4b of the P-type pillar (i.e., in the height range of from h1 to h1+h2'); wherein Nn0 is equal to, for example, $3 \times 10^{15}$ atoms/cm$^3$.

In this case, the optimal doping concentration of the P-type pillar 4 Pp0 is equal to $(h1 \times 1.15 + h2' \times 0.8) \times Nn0/(h1+h2')$, wherein the value 1.15 is the ratio of the average doping concentration of the linearly changed portion of the N-type pillar 2a to Nn0.

The doping concentrations in the P-type pillar 4 in the superjunction structure of the present invention may be selected as follows: the doping concentration of the main body 4a of the P-type pillar is equal to Pp0, and the doping concentration of the additional structure 4b of the P-type pillar is higher than Pp0. For example, referring to FIG. 3c, the doping concentration of the main body 4a is Pp0 and the doping concentration of the additional structure 4b is Pp0× 300%.

The above embodiments are provided for the purpose of describing the invention and are not intended to limit the scope of the invention in any way. It will be apparent to those skilled in the art that various modifications and variations can be made without departing from the spirit or scope of the invention. Thus, it is intended that the present invention covers the modifications and variations of this invention.

What is claimed is:

1. A superjunction structure, comprising a first-type epitaxial layer and a plurality of second-type pillars formed therein, a part of the first-type epitaxial layer between each two adjacent second-type pillars serving as a first-type pillar, so as to form alternately arranged first-type pillars and second-type pillars, wherein:

each second-type pillar consists of at least two sections in a vertical direction, a second section from the top down having a groove formed in its top, the groove having a profile wider at the top and narrower at the bottom, a first section from the top down being formed in the groove and also having a profile wider at the top and narrower at the bottom;

each section of the second-type pillar includes a second type impurity, doping concentrations of the second type impurity in the respective sections decreasing from the top down;

each first-type pillar includes first-type impurities distributed in the vertical direction, a doping concentration of the first-type impurities in a lower portion of the first-type pillar being greater than or equal to a doping concentration of the first-type impurities in an upper portion of the first-type pillar;

in a bottom of the first-type epitaxial layer, a total quantity of the second-type impurity in the second-type pillars is less than a total quantity of the first-type impurities in the first-type pillars;

in a top of the first-type epitaxial layer, a total quantity of the second-type impurity in the second-type pillars is greater than a total quantity of the first-type impurities in the first-type pillars, further wherein, the first-type is N-type and the second-type is P-type, or the first-type is P-type and the second-type is N-type.

2. The superjunction structure according to claim 1, wherein:

in each second-type pillar, the first section from the top down forms an additional structure of the second-type pillar, and remaining sections of the second-type pillar form a main body of the second-type pillar;

a distance between a bottom of the main body and a bottom of the additional structure is from 25 μm to 30 μm, and a height of the additional structure is from 2 μm to 8 μm.

3. The superjunction structure according to claim 2, wherein in each second-type pillar, a doping concentration of the second type impurity in the main body is lower than or equal to an even doping concentration of the second-type pillar, while a doping concentration of the second type impurity in the additional structure is greater than the even doping concentration of the second-type pillar, further wherein the even doping concentration of the second-type pillar is defined as a doping concentration of the second-type pillar measured when the second-type pillar is evenly doped with the second-type impurity and a total quantity of the second-type impurity in the second-type pillar is equal to a total quantity of the first-type impurities in a first-type pillar.

4. The superjunction structure according to claim 3, wherein the doping concentration of the second type impurity in the main body is 0.5~1 time of the even doping concentration of the second-type pillar, and the doping concentration of the second type impurity in the additional structure is 3~10 times of the even doping concentration of the second-type pillar.

5. The superjunction structure according to claim 2, wherein in each second-type pillar, a doping concentration of the second type impurity in the main body is greater than an even doping concentration of the second-type pillar but lower than a maximum doping concentration within the first-type pillar, while a doping concentration of the second type impurity in the additional structure is greater than the even doping concentration of the second-type pillar, further wherein the even doping concentration of the second-type pillar is defined as a doping concentration of the second-type pillar measured when the second-type pillar is evenly doped with the second-type impurity and a total quantity of the second-type impurity in the second-type pillar is equal to a total quantity of the first-type impurities in a first-type pillar.

6. A method of manufacturing the superjunction structure according to claim 1, comprising:

providing a first-type epitaxial layer and forming a plurality of trenches in the first-type epitaxial layer by etch, wherein a doping concentration in a lower portion of the first-type epitaxial layer is greater than or equal to a doping concentration in an upper portion of the first-type epitaxial layer;

filling the trenches with a second-type silicon by conducting at least two filing steps from the bottom up, each latter filing step adopting a greater doping concentration of the second-type silicon than its former filing step, wherein the second-type silicon filled by the second last filing step in each trench has a groove formed in its top, the groove having a profile wider at the top and narrower at the bottom, the second-type silicon filled by the last filing step in each trench being formed in the groove; and removing the second-type silicon above a surface of the first-type epitaxial layer.

7. A superjunction MOS transistor, comprising:

a first-type heavily doped substrate;

a first-type epitaxial layer formed on the first-type heavily doped substrate; and a plurality of second-type pillars formed in the first-type epitaxial layer, wherein:

a part of the first-type epitaxial layer between each two adjacent second-type pillars serves as a first-type pillar, so as to form alternately arranged first-type pillars and second-type pillars;

each second-type pillar consists of at least two sections in a vertical direction, a second section from the top down having a groove formed in its top, the groove having a profile wider at the top and narrower at the bottom, a first section from the top down being formed in the groove and also having a profile wider at the top and narrower at the bottom;

each section of the second-type pillar includes a second type impurity, doping concentrations of the second type impurity in the respective sections decreasing from the top down;

each first-type pillar includes first-type impurities distributed in the vertical direction, a doping concentration of the first-type impurities in a lower portion of the first-type pillar being greater than or equal to a doping concentration of the first-type impurities in an upper portion of the first-type pillar, further wherein, the first-type is N-type and the second-type is P-type, or the first-type is P-type and the second-type is N-type.

8. The superjunction MOS transistor according to claim 7, wherein in each second-type pillar, the first section from the top down forms an additional structure of the second-type pillar, and remaining sections of the second-type pillar form a main body of the second-type pillar; a distance between a bottom of the main body and a bottom of the additional structure is from 25 μm to 30 μm; and a height of the additional structure is from 2 μm to 8 μm.

9. The superjunction MOS transistor according to claim 8, wherein in each second-type pillar, a doping concentration of the second type impurity in the main body is lower than or equal to an even doping concentration of the second-type pillar, while a doping concentration of the second type impurity in the additional structure is greater than the even doping concentration of the second-type pillar, further wherein the even doping concentration of the second-type pillar is defined as a doping concentration of the second-type pillar measured when the second-type pillar is evenly doped with the second-type impurity and a total quantity of the second-type impurity in the second-type pillar is equal to a total quantity of the first-type impurities in a first-type pillar.

10. The superjunction MOS transistor according to claim 9, wherein the doping concentration of the second type impurity in the main body is 0.5~1 time of the even doping concentration of the second-type pillar, and the doping concentration of the second type impurity in the additional structure is 3~10 times of the even doping concentration of the second-type pillar.

11. The superjunction MOS transistor according to claim 8, wherein in each second-type pillar, a doping concentration of the second type impurity in the main body is greater than an even doping concentration of the second-type pillar but lower than a maximum doping concentration within the first-type pillar, while a doping concentration of the second type impurity in the additional structure is greater than the even doping concentration of the second-type pillar, further wherein the even doping concentration of the second-type pillar is defined as a doping concentration of the second-type pillar measured when the second-type pillar is evenly doped with the second-type impurity and a total quantity of the second-type impurity in the second-type pillar is equal to a total quantity of the first-type impurities in a first-type pillar.

12. The superjunction MOS transistor according to claim 7, further comprising:

gate oxide layers of bowl-shapes, each being in contact with a top of a first-type pillar;

polysilicon gates, each being surrounded by a gate oxide layer;

second-type wells, each being in contact with a top of a second-type pillar and parts of the tops of the first-type pillars adjacent to the second-type pillar;

first-type heavily doped source regions and second-type heavily doped contact regions, formed under surfaces of the second-type wells;

a dielectric layer, formed above the gate oxide layers and the polysilicon gates;

contact hole electrodes, formed above the first-type heavily doped source regions and the second-type heavily doped contact regions;

a surface metal layer, formed on the dielectric layer and the contact hole electrodes;

a source electrode, picked up from the surface metal layer;

gate electrodes, picked up from the polysilicon gates;

a backside metal layer, formed on a backside of the first-type heavily doped substrate; and a drain electrode, picked up from the backside metal layer.

\* \* \* \* \*